US011017866B2

(12) United States Patent
Markov et al.

(10) Patent No.: US 11,017,866 B2
(45) Date of Patent: May 25, 2021

(54) METHOD OF IMPROVING READ CURRENT STABILITY IN ANALOG NON-VOLATILE MEMORY USING FINAL BAKE IN PREDETERMINED PROGRAM STATE

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/803,401

(22) Filed: Feb. 27, 2020

(65) Prior Publication Data

US 2021/0065817 A1    Mar. 4, 2021

Related U.S. Application Data

(60) Provisional application No. 62/895,458, filed on Sep. 3, 2019.

(51) Int. Cl.
*G11C 16/24* (2006.01)
*G11C 16/26* (2006.01)
(Continued)

(52) U.S. Cl.
CPC .............. *G11C 16/26* (2013.01); *G11C 16/16* (2013.01); *H01L 27/11524* (2013.01); *H01L 27/11529* (2013.01)

(58) Field of Classification Search
CPC ....... G11C 17/16; G11C 17/18; G11C 29/027; G11C 16/26; G11C 29/42; G11C 16/0483;
(Continued)

(56) References Cited

U.S. PATENT DOCUMENTS 5,029,130 A    7/1991   Yeh
5,583,810 A    12/1996  Van Houdt
(Continued)

FOREIGN PATENT DOCUMENTS

EP    1503384    2/2005
EP    2777065    12/2016
(Continued)

*Primary Examiner* — Thong Q Le
(74) *Attorney, Agent, or Firm* — DLA Piper LLP (US)

(57) ABSTRACT

A method of improving stability of a memory device having a controller configured to program each of a plurality of non-volatile memory cells within a range of programming states bounded by a minimum program state and a maximum program state. The method includes testing the memory cells to confirm the memory cells are operational, programming each of the memory cells to a mid-program state, and baking the memory device at a high temperature while the memory cells are programmed to the mid-program state. Each memory cell has a first threshold voltage when programmed in the minimum program state, a second threshold voltage when programmed in the maximum program state, and a third threshold voltage when programmed in the mid-program state. The third threshold voltage is substantially at a mid-point between the first and second threshold voltages, and corresponds to a substantially logarithmic mid-point of read currents.

5 Claims, 5 Drawing Sheets

(51) Int. Cl.
*G11C 16/16* (2006.01)
*H01L 27/11529* (2017.01)
*H01L 27/11524* (2017.01)

(58) Field of Classification Search
CPC ..... G11C 16/08; G11C 16/10; G11C 16/3459; G11C 2029/1202; G11C 29/025; G11C 29/44; G11C 29/50012; G11C 7/222; G11C 8/08; G11C 11/56; G11C 13/0002
See application file for complete search history.

(56) References Cited

U.S. PATENT DOCUMENTS

| | | |
|---|---|---|
| 6,618,290 B1 | 9/2003 | Wang et al. |
| 6,747,310 B2 | 6/2004 | Fan et al. |
| 6,855,980 B2 | 2/2005 | Wang et al. |
| 7,315,056 B2 | 1/2008 | Klinger |
| 7,405,969 B2 | 7/2008 | Eitan |
| 7,868,375 B2 | 1/2011 | Liu et al. |
| 8,711,636 B2 | 4/2014 | Do et al. |
| 9,195,586 B2 | 11/2015 | Cometti |
| 2005/0083735 A1 | 4/2005 | Chen et al. |
| 2005/0262970 A1 | 12/2005 | Hsien |
| 2006/0123280 A1 | 6/2006 | Tran |
| 2012/0113714 A1 | 5/2012 | Choy et al. |
| 2013/0114337 A1 | 5/2013 | Markov |
| 2016/0240269 A1 | 8/2016 | Zhou |
| 2016/0306572 A1 | 10/2016 | Ryan |
| 2018/0005703 A1* | 1/2018 | Chung ................. H01L 27/224 |
| 2020/0065023 A1 | 2/2020 | Markov et al. |

FOREIGN PATENT DOCUMENTS

| | | |
|---|---|---|
| TW | 200516591 | 5/2005 |
| TW | 200541060 | 12/2005 |
| TW | 200737211 | 10/2007 |
| TW | 201314698 | 4/2013 |
| TW | 201319801 | 5/2013 |
| TW | 201511013 | 3/2015 |
| TW | 201642262 | 12/2016 |
| TW | 201743326 | 12/2017 |
| WO | 99/07000 | 2/1999 |
| WO | 2001/065567 | 9/2001 |
| WO | 2005/001843 | 1/2005 |
| WO | 2008/157084 | 12/2008 |
| WO | 2013/070424 | 5/2013 |

* cited by examiner

METHOD OF IMPROVING READ CURRENT STABILITY IN ANALOG NON-VOLATILE MEMORY USING FINAL BAKE IN PREDETERMINED PROGRAM STATE

RELATED APPLICATIONS

This application claims the benefit of U.S. Provisional Application No. 62/895,458 filed on Sep. 3, 2019, and which is incorporated herein by reference.

FIELD OF THE INVENTION

The present invention relates to non-volatile memory devices, and more particularly to improving the stability of the memory cell current during read operations.

BACKGROUND OF THE INVENTION

Non-volatile memory devices are well known in the art. See for example U.S. Pat. No. 7,868,375, which discloses a four-gate memory cell configuration. Specifically, FIG. 1 of the present application illustrates a split gate memory cell 10 with spaced apart source and drain regions 14/16 formed in a silicon semiconductor substrate 12. The source region 14 can be referred to as a source line SL (because it commonly is connected to other source regions for other memory cells in the same row or column), and the drain region 16 is commonly connected to a bit line by a bit line contact 28. A channel region 18 of the substrate is defined between the source/drain regions 14/16. A floating gate 20 is disposed over and insulated from (and controls the conductivity of) a first portion of the channel region 18 (and partially over and insulated from the source region 14). A control gate 22 is disposed over and insulated from the floating gate 20. A select gate 24 is disposed over and insulated from (and controls the conductivity of) a second portion of the channel region 18. An erase gate 26 is disposed over and insulated from the source region 14 and is laterally adjacent to the floating gate 20. A plurality of such memory cells can be arranged in rows and columns to form a memory cell array.

Figure 1:
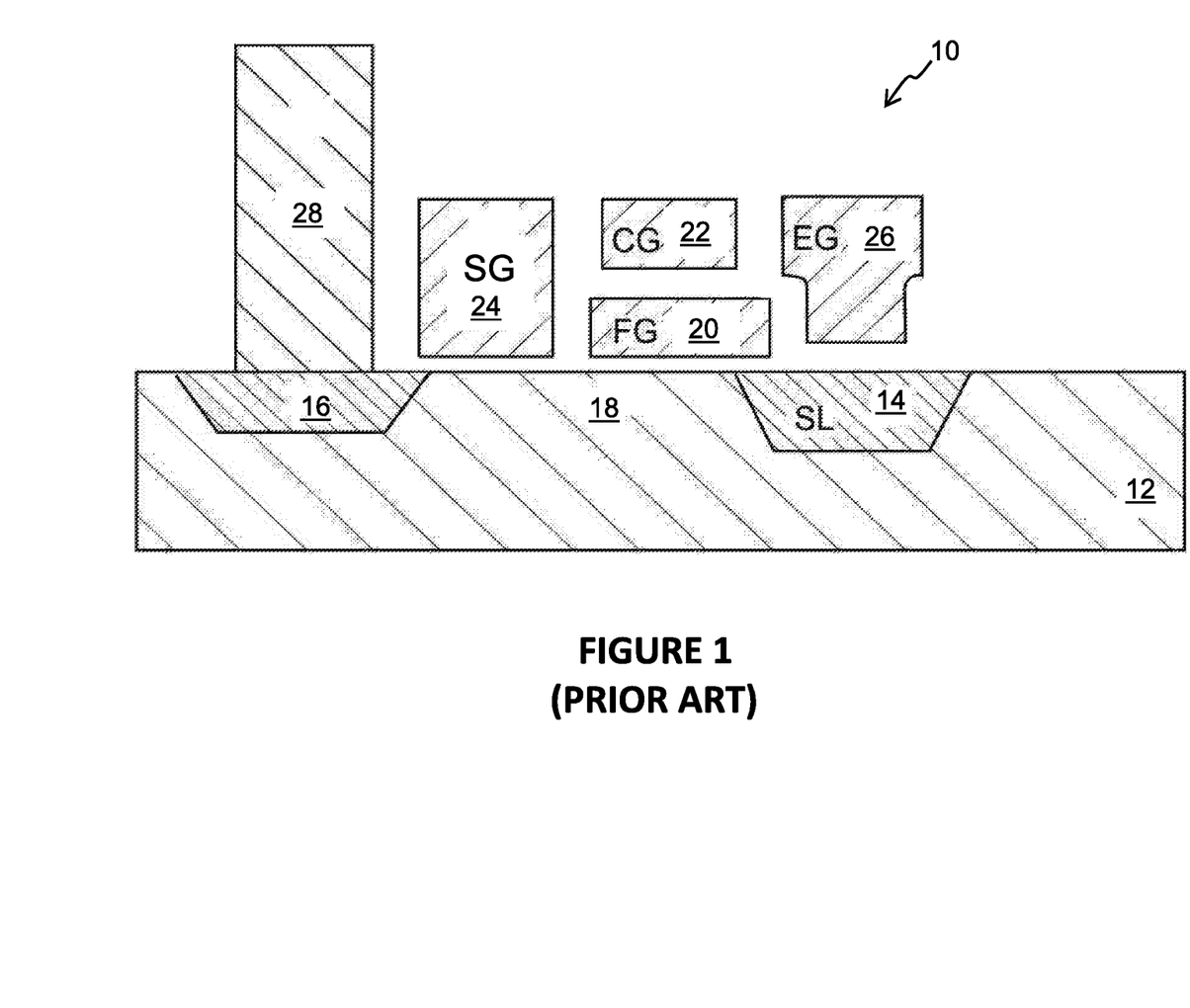
FIG. 1 is a side cross sectional view of a memory cell of the prior art.

Various combinations of voltages are applied to the control gate 22, select gate 24, erase gate 26 and/or source and drain regions 14/16, to program the memory cell (i.e., injecting electrons onto the floating gate), to erase the memory cell (i.e., removing electrons from the floating gate), and to read the memory cell (i.e., measuring or detecting the conductivity of the channel region 18 to determine the programming state of the floating gate 20).

Memory cell 10 can be operated in a digital manner, where the memory cell is set to one of only two possible states: a programmed state and an erased state. The memory cell is erased by placing a high positive voltage on the erase gate 26, and optionally a negative voltage on the control gate 22, to induce tunneling of electrons from the floating gate 20 to the erase gate 26 (leaving the floating gate in a more positively charged stated—the erased state). Memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with some electrons becoming accelerated and heated whereby they are injected onto the floating gate 20 by hot-electron injection (leaving the floating gate in a more negatively charged state—the programmed state). Memory cell 10 can be read by placing positive voltages on the select gate 24 (turning on the channel region portion under the select gate 24) and drain region 16 (and optionally on the erase gate 26 and/or the control gate 22), and sensing current flow through the channel region 18. If the floating gate 20 is positively charged (erased), the memory cell will be turned on, and electrical current will flow from source region 14 to drain region 16 (i.e. the memory cell 10 is sensed to be in its erased "1" state based on sensed current flow). If the floating gate 20 is negatively charged (programmed), the channel region under the floating gate is turned off, thereby preventing any current flow (i.e., the memory cell 10 is sensed to be in its programmed "0" state based on no current flow).

The following table provides non-limiting examples of erase, program and read voltages:

TABLE 1

|  | WL (SG) | BL (Drain) | Source | EG | CG |
|---|---|---|---|---|---|
| Erase | 0 V | 0 V | 0 V | 11.5 V | 0 V |
| Program | 1 V | 1 µA | 4.5 V | 4.5 V | 10.5 V |
| Read | Vcc | 0.6 V | 0 V | 0 V | Vcc |

Memory cell 10 can alternately be operated in an analog manner where the memory state (i.e. the amount of charge, such as the number of electrons, on the floating gate) of the memory cell can be continuously changed anywhere from a fully erased state (fewest electrons on the floating gate) to a fully programmed state (highest number of electrons on the floating gate), or just a portion of this range. This means the cell storage is analog, which allows for very precise and individual tuning of each memory cell in the memory cell array. Alternatively, the memory could be operated as a MLC (multilevel cell) where it is configured to be programmed to one of many discrete values (such as 16 or 64 different values). In the case of analog or MLC programming, the programming voltages are applied for only a limited time, or as a series of pulses, until the desired programming state is achieved. In the case of multiple programming pulses, intervening read operations between programming pulses can be used to determine if the desired programming state has been achieved (in which case programming ceases) or has not been achieved (in which case programming continues).

Memory cell 10 operated in an analog manner or as an MLC could be more sensitive to noise and read current instabilities which can adversely affect the accuracy of the memory device. One source of read current instability in analog non-volatile memory devices is the capture and emission of electrons by electron traps on the gate oxide—channel interface. The gate oxide is the insulation layer that separates the floating gate 20 and the channel region 18 of substrate 12. When an electron is captured on an interface trap, it reduces the channel conductivity during a read operation, and thus increases the threshold voltage Vt of the memory cell (i.e., the minimum voltage(s) on the control gate needed to turn on the channel region of the memory cell to produce a certain level of current, 1 uA being an example). When the control gate voltage is at or above the threshold voltage, a conducting path is created between the source and drain regions. When the control gate voltage is below the threshold voltage, a conducting path is not created, and any source/drain current is considered sub-threshold or leakage current. These single events of electron trap recharging result in 1) random telegraph noise (RTN) and 2) a one-directional threshold voltage (Vt) shift (also causing the read operation channel current to change), which is referred to as relaxation or CCI—cell current instability.

Such relaxation has been detected after the memory cell has been kept for a long time at room temperature or has been baked at high temperature in one state and then changed to a different state. The relaxation appears as a small drift of the memory cell new state towards the preceding state. For example, if the memory cell is kept for some time in its erased state (which is characterized by a low threshold voltage Vt and a high channel current during a read operation), and then is subsequently programmed into its programmed state (which is characterized by a high threshold voltage Vt and a low channel current during a read operation), the threshold voltage Vt has been found to drop slightly, and the read current during a read operation has been found to increase slightly, over time under the same read conditions. The Vt and read current shifts are relatively small when compared with typical cell current operation window between 1 and 0 states for memory cells operated in a digital manner. However, these shifts may not be negligible for memory cells operated as MLC (multilevel cell) or in an analog manner.

There is a need to reduce read current instabilities in non-volatile memory devices.

BRIEF SUMMARY OF THE INVENTION

The aforementioned problems and needs are addressed by a method of improving stability of a memory device that includes a plurality of non-volatile memory cells and a controller configured to program each of the memory cells within a range of programming states bounded by a minimum program state and a maximum program state. The method includes testing the memory cells to confirm the memory cells are operational, programming each of the memory cells to a mid-program state, and baking the memory device at a high temperature while the memory cells are programmed to the mid-program state. For each of the memory cells, the memory cell has a first threshold voltage when programmed in the minimum program state, the memory cell has a second threshold voltage when programmed in the maximum program state, and the memory cell has a third threshold voltage when programmed in the mid-program state, wherein the third threshold voltage is substantially at a mid-point between the first and second threshold voltages.

A method of improving stability of a memory device that includes a plurality of non-volatile memory cells each including at least a floating gate disposed over and insulated from a channel region of a semiconductor substrate and a control gate disposed over and insulated from the floating gate, and a controller configured to program each of the memory cells within a range of programming states bounded by a minimum program state and a maximum program state, and to read each of the memory cells using a read voltage applied to the control gate. The method includes testing the memory cells to confirm the memory cells are operational, programming each of the memory cells to a mid-program state and baking the memory device at a high temperature while the memory cells are programmed to the mid-program state. For each of the memory cells, the memory cell produces a first read current during a read operation using the read voltage applied to the control gate when programmed in the minimum program state, the memory cell produces a second read current during a read operation using the read voltage applied to the control gate when programmed in the maximum program state, and the memory cell produces a third read current during a read operation using the read voltage applied to the control gate when programmed in the mid-program state, wherein the third read current is substantially at a logarithmic mid-point between the first and second read currents.

Other objects and features of the present invention will become apparent by a review of the specification, claims and appended figures.

DETAILED DESCRIPTION OF THE INVENTION

The present invention is a technique for stabilizing the read current of non-volatile memory cells of the type of FIG. 1 to improve read operation accuracy and memory retention longevity. The read stabilization technique involves programing the finished and operational memory cell to a predetermined program state before performing a final high temperature bake process. Specifically, during the memory device testing process, the memory array in the device can undergo many thermal operations with various data patterns. However, once the memory device testing is complete, all the memory cells are then programmed to a predetermined mid-program state, which is then followed by a final, high temperature bake of the memory device. It has been discovered that by performing this final, high temperature bake while the memory cells are programmed to the mid-program state, memory cell threshold voltage (Vt) shift over time, and thus read operation current drift over time, is reduced.

Figure 2:
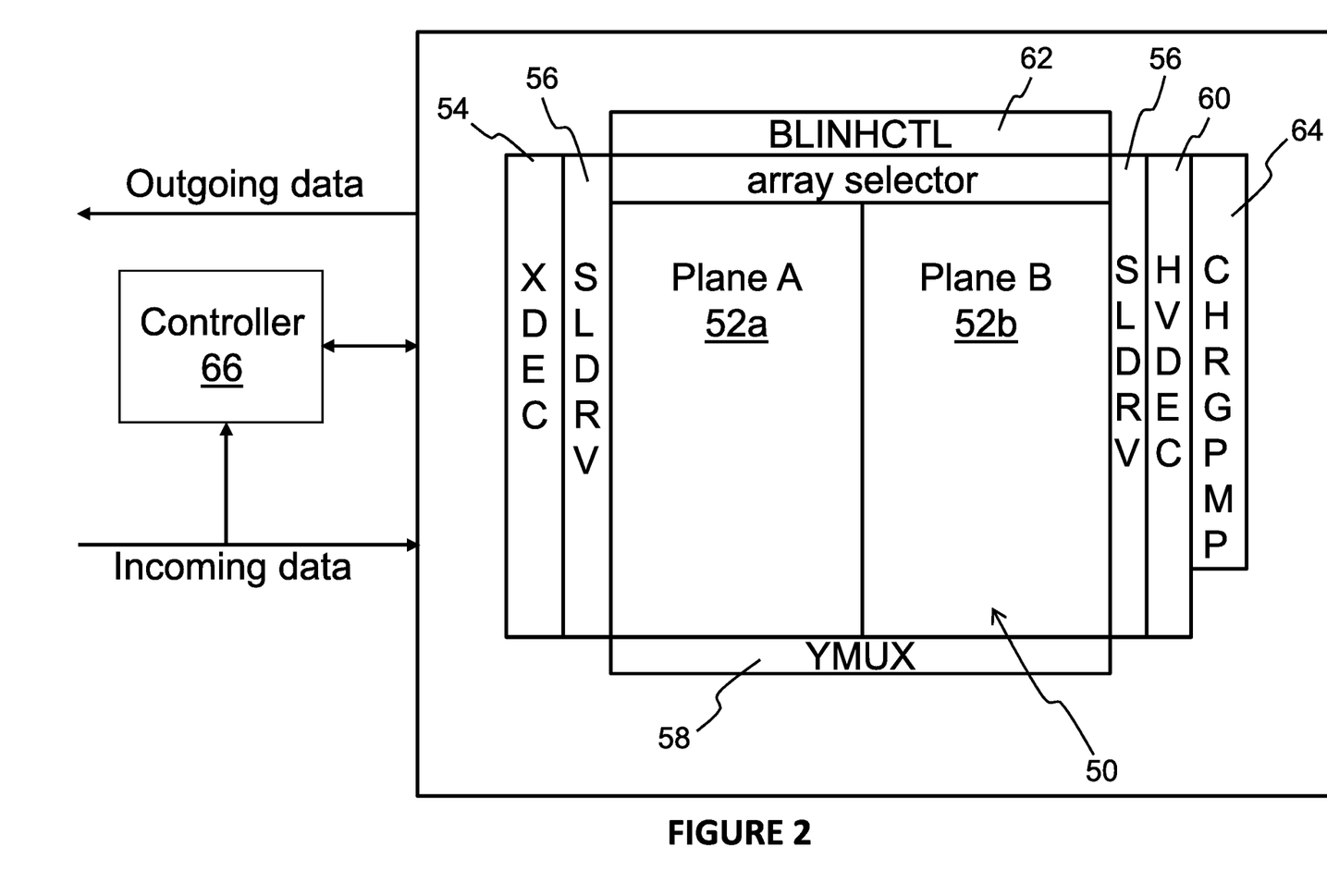
FIG. 2 is a diagram illustrating the components of a memory device.

The desired mid-program state is a function of the controller configuration for the memory array, which can be better understood from the architecture of an exemplary memory device as illustrated in FIG. 2. The memory device includes an array 50 of the non-volatile memory cells 10, which can be segregated into two separate planes (Plane A 52a and Plane B 52b). The memory cells 10 can be of the type shown in FIG. 1, formed on a single chip, arranged in a plurality of rows and columns in the semiconductor substrate 12. Adjacent to the array of non-volatile memory cells are address decoders (e.g. XDEC 54), a source line driver (e.g. SLDRV 56), a column decoder (e.g. YMUX 58), a high voltage row decoder (e.g. HVDEC 60) and a bit line controller (BLINHCTL 62), which are used to decode addresses and supply the various voltages to the various memory cell gates and regions during read, program, and erase operations for selected memory cells. Column decoder 58 includes a sense amplifier containing circuitry for measuring the currents on the bit lines during a read operation. Controller 66 (containing control circuitry) controls the various device elements to implement each operation (program, erase, read) on target memory cells. Charge pump CHRGPMP 64 provides the various voltages used to read, program and erase the memory cells under the control of the controller 66. Controller 66 is configured to operate the memory device to program, erase and read the memory cells 10.

It is the controller 66 that dictates the minimum and maximum program states of the memory cells that are usable during normal user operation. The minimum program state is that programming state to which each of the memory cells can be programmed (i.e., the most erased state), under the control of the controller 66 during normal user operation, for which the lowest number of electrons are located on the floating gate 20 and the memory cell produces the highest (maximum) source/drain current during a normal read operation. The maximum program state is that programming state to which each of the memory cells can be programmed, under the control of the controller 66 during normal user operation, for which the highest number of electrons are located on the floating gate 20 and the memory cell produces the lowest (minimum) source/drain current during a normal read operation.

Figure 3:
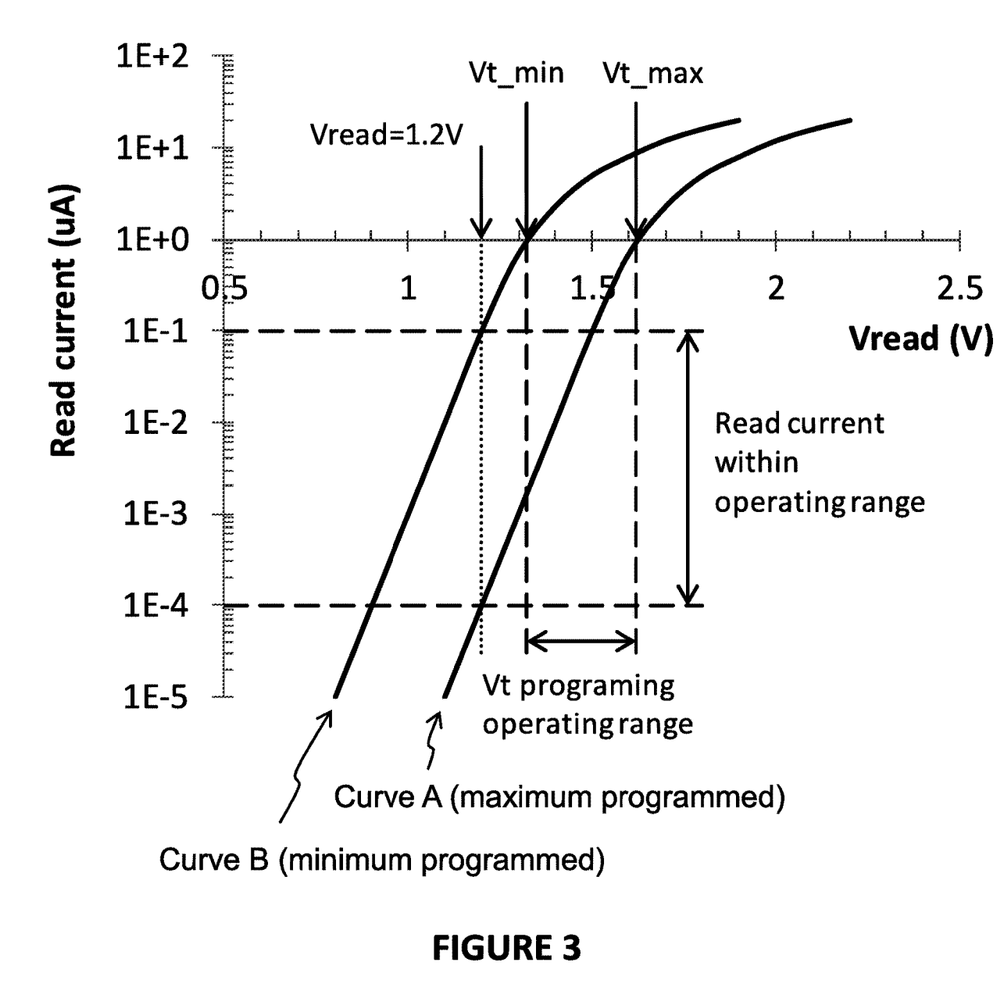
FIG. 3 is a graph illustrating the memory cell operating range in terms of read current and threshold voltage Vt in the subthreshold operating range.

The mid-program state that is used during the final device high temperature bake operation is preferably that program state that produces a read current during a read operation that is logarithmically the substantial mid-point between the minimum and the maximum read currents for the maximum and minimum program states, respectively, of the defined programming operating range as dictated by the controller 66. The mid-program state can be determined by means of either threshold voltage Vt or read current as a parameter. The memory cell is a MOSFET transistor, and thus Vt and read current are directly related via basic transistor equations, therefore, the memory cell operating range can be determined in terms of either read current or Vt. An example of memory cell current-voltage (I-V) characteristics which demonstrate the relationship between Vt and read current is shown in FIG. 3, where the two curves represent the I-V characteristics for the minimum and maximum program states for the memory cell, respectively. In this non-limiting example, placing a voltage on the control gate at or above the threshold voltage will result in a read current (between the source and drain regions) during a read operation that is 1 µA or greater, which is considered to be the amount of current in this example indicative that the conductive path between the source/drain regions is created. The rightward inflection of the current-voltage (I-V) curves at 1 µA in FIG. 3 indicates that is the read current which is achieved when the voltage on the control gate has reached threshold voltage Vt.

In the example of FIG. 3, the right-hand curve (Curve A) is the I-V curve for the exemplary memory cell in its maximum programmed state of its analog operating range, and the left-hand curve (Curve B) is the I-V curve for the exemplary memory cell in its minimum programmed state of its analog operating range. The controller for this memory cell is configured to use a read voltage on the control gate of 1.2 V, which means this memory cell is read in a subthreshold state (i.e., using subthreshold current to detect the program state of the memory cell). Given the two I-V curves for maximum programmed and minimum programmed states, the operating range of the read current for this memory cell as operated by the controller is between 100 nA and 100 pA. The range of programming states corresponds to a Vt range of about 0.3V (between about 1.3V and about 1.6V). A read instability of the programmed memory cell can be represented either in terms of Vt variations, or in terms of read current variations during read operations. As set forth below, either Vt or read current can be used as a parameter to quantify the solution of read current fluctuation reduction. Therefore, the mid-program state is defined as program state that corresponds to substantially a halfway in terms of Vt for the minimum and the maximum program states achievable during normal operation, and corresponds to logarithmically the substantial mid-point between the minimum and the maximum read currents for the maximum and minimum program states, respectively.

Figure 4:
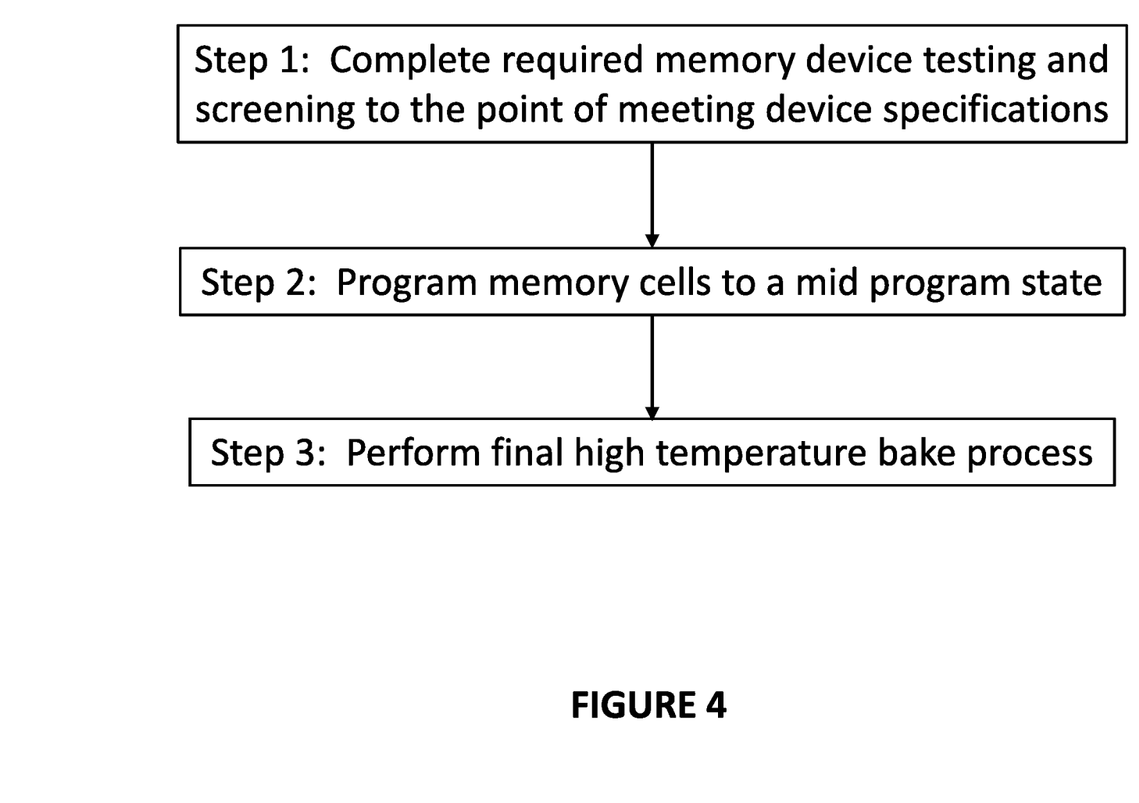
FIG. 4 is a flow diagram showing the steps of programming and baking the memory cells.
Figure 5:
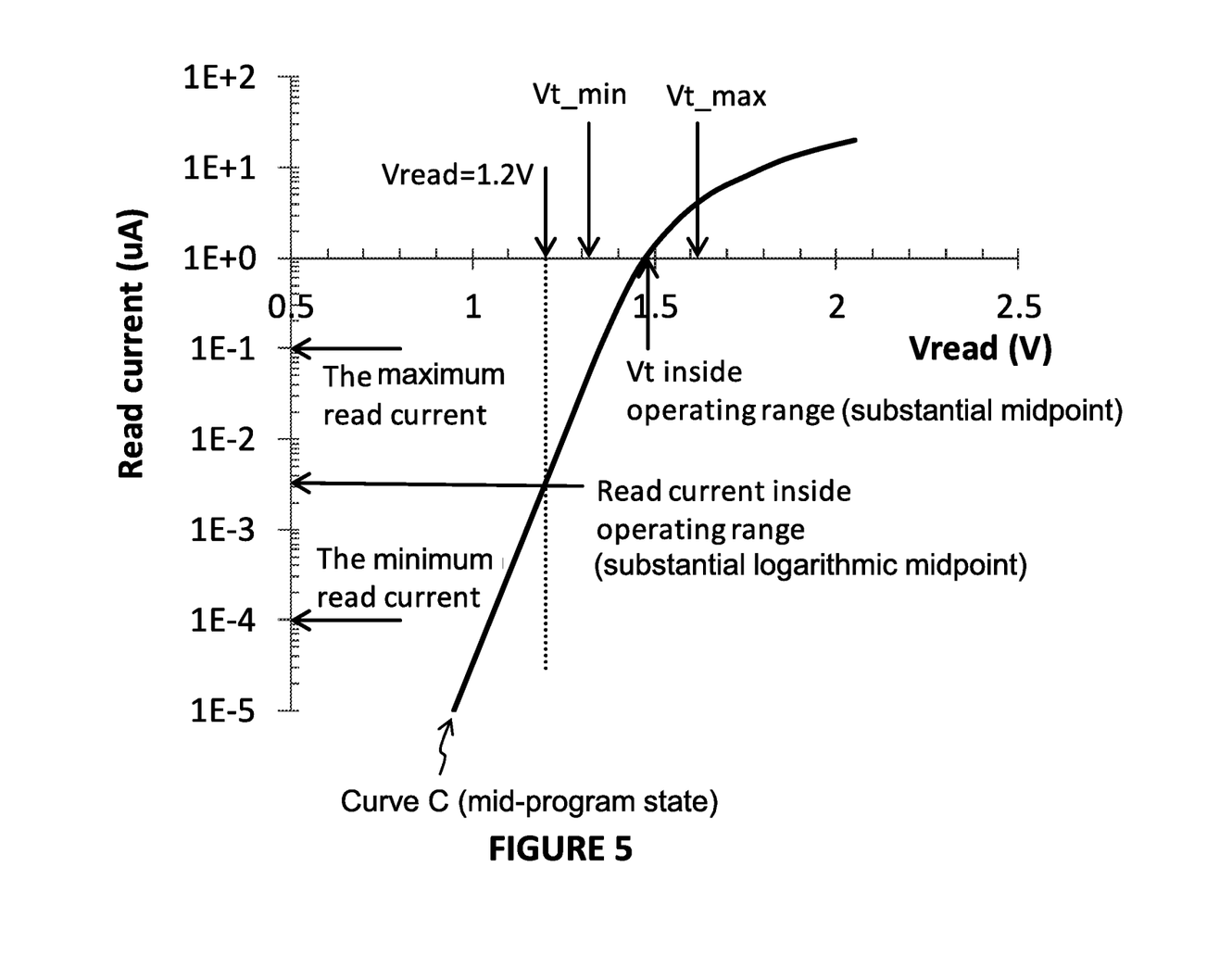
FIG. 5 is a graph illustrating an example of I-V characteristics of a memory cell inside the operating range.

There are three major stages to implementing this read stabilization technique, as illustrated in FIG. 4. First (step 1), the memory device, including the memory cells 10 and their controller 66, are tested to the point that they are operational and no further high temperature bake operations are needed to complete the testing of the device. Second (step 2), all the memory cells 10 are programmed to substantially the mid-program state. Third (step 3), the memory device including all the memory cells 10 programmed to the mid-program state are subjected to a final high temperature bake process. FIG. 5 shows an example of the memory cell I-V characteristic curve (Curve C) for a memory cell described above with respect to FIG. 3 programmed to substantially a mid-program state. Its threshold voltage Vt is about 1.48V, which is substantially at a mid-point between Vt_min and Vt_max for the minimum and maximum programmed states, respectively (i.e., the mid-point threshold voltage is substantially half way between Vt_min and Vt_max). Similarly, the read current of the memory cell when the read voltage of 1.2 V is placed on the control gate during a read operation is about 3 nA, which is logarithmically the substantial mid-point between 100 nA and 100 pA for the minimum and maximum programmed states, respectively (i.e., the mid-point read current is substantially half way between 100 nA and 100 pA on a logarithmic scale).

The high bake temperature is an elevated temperature which exceeds the highest operating temperature endured by the memory device during normal use. For example, the final high temperature bake process can include baking the memory device for 24 hours at 175° C. if specification for the highest operating temperature for the product under user conditions is 150° C. The minimum bake time depends on bake temperature and can be shorter at higher temperatures. Preferably, for the memory cell shown in FIG. 1, the bake time can be up to 24 hours at a bake temperature of 175° C. In general, the longer bake time, the better improvement effect on read instability reduction. As a practical example, one can set assembled parts for one-day bake at 175° C. if chosen package allows such high temperature treatment. Once the memory device, packaging and final testing and bake are complete, the memory device will operate with improved read stability under user conditions.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps may need to be performed in the exact order illustrated or claimed unless specified.

What is claimed is:

1. A method of improving stability of a memory device that includes a plurality of non-volatile memory cells and a controller configured to program each of the memory cells within a range of programming states bounded by a minimum program state and a maximum program state, the method comprising:
  testing the memory cells to confirm the memory cells are operational;
  programming each of the memory cells to a mid-program state; and
  baking the memory device at a high temperature while the memory cells are programmed to the mid-program state;
  wherein, for each of the memory cells:
    the memory cell has a first threshold voltage when programmed in the minimum program state,
    the memory cell has a second threshold voltage when programmed in the maximum program state, and
    the memory cell has a third threshold voltage when programmed in the mid-program state,
    wherein the third threshold voltage is substantially at a mid-point between the first and second threshold voltages;
  wherein each of the memory cells comprises:
    spaced apart source and drain regions formed in a semiconductor substrate, with a channel region of the substrate extending there between,
    a floating gate disposed vertically over and insulated from a first portion of the channel region,
    a select gate disposed vertically over and insulated from a second portion of the channel region, and
    a control gate disposed vertically over and insulated from the floating gate.

2. The method of claim 1, wherein each of the memory cells further comprises:
  an erase gate disposed over and insulated from the source region.

3. A method of improving stability of a memory device that includes a plurality of non-volatile memory cells each including at least a floating gate disposed over and insulated from a channel region of a semiconductor substrate and a control gate disposed over and insulated from the floating gate, and a controller configured to program each of the memory cells within a range of programming states bounded by a minimum program state and a maximum program state, and to read each of the memory cells using a read voltage applied to the control gate, the method comprising:
  testing the memory cells to confirm the memory cells are operational;
  programming each of the memory cells to a mid-program state; and
  baking the memory device at a high temperature while the memory cells are programmed to the mid-program state;
  wherein, for each of the memory cells:
    the memory cell produces a first read current during a read operation using the read voltage applied to the control gate when programmed in the minimum program state,
    the memory cell produces a second read current during a read operation using the read voltage applied to the control gate when programmed in the maximum program state, and
    the memory cell produces a third read current during a read operation using the read voltage applied to the control gate when programmed in the mid-program state,
    wherein the third read current is substantially at a logarithmic mid-point between the first and second read currents.

4. The method of claim 3, wherein each of the memory cells comprises:
  spaced apart source and drain regions formed in a semiconductor substrate, with the channel region of the substrate extending there between,
  the floating gate is disposed vertically over and insulated from a first portion of the channel region,
  a select gate disposed vertically over and insulated from a second portion of the channel region.

5. The method of claim 4, wherein each of the memory cells further comprises:
  an erase gate disposed over and insulated from the source region.

* * * * *